United States Patent
Yomtoubian

[11] Patent Number: 6,035,411
[45] Date of Patent: Mar. 7, 2000

[54] METHOD FOR MULTIPLE VERTICLE AND/OR HORIZONTAL LEVELS OF MEMORY REDUNDANCY

[75] Inventor: Ruben Yomtoubian, Saratoga, Calif.

[73] Assignee: Hitachi Computer Products, Inc., Santa Clara, Calif.

[21] Appl. No.: 08/777,942

[22] Filed: Dec. 23, 1996

[51] Int. Cl.[7] .................................................. G06F 11/00
[52] U.S. Cl. ............................................... 714/6; 711/117
[58] Field of Search ................................... 711/113, 114, 711/117, 122; 395/182.04, 182.05, 183.18, 872; 710/52; 714/6, 7, 42

[56] References Cited

U.S. PATENT DOCUMENTS

| | | | |
|---|---|---|---|
| 5,140,592 | 8/1992 | Idleman et al. | 714/5 |
| 5,274,645 | 12/1993 | Idleman et al. | 714/6 |
| 5,448,719 | 9/1995 | Schultz et al. | 395/182.03 |
| 5,548,711 | 8/1996 | Brant et al. | 711/114 |
| 5,586,291 | 12/1996 | Lasker et al. | 711/113 |
| 5,611,069 | 3/1997 | Matoba | 711/114 |
| 5,708,771 | 1/1998 | Brant et al. | 395/182.2 |

*Primary Examiner*—Eddie P. Chan
*Assistant Examiner*—Gary J. Portka
*Attorney, Agent, or Firm*—Graham & James LLP

[57] ABSTRACT

The present invention is a method and apparatus for organizing memory buffers between an i/o subsystem and a computer system. The present invention organizes the memory buffers that exist between a computer system and an associated i/o subsystem into a memory hierarchy. An example of such a hierarchy includes, in order, a disk buffer, a disk cache, a controller memory and a computer system memory. Each datablock in the memory hierarchy is given an associated index word. The index word contains the address of the datablock within the media of the disk drive and contains index bits which indicate where the datablock may be found in the memory hierarchy. As a datablock moves between the disk drive and the computer system, a mirror copy of the datablock is maintained in a memory buffer that is in the next adjacent level of the memory hierarchy. In this way, the mirror copy may be used if the datablock becomes inaccessible.

8 Claims, 7 Drawing Sheets

METHOD FOR MULTIPLE VERTICLE AND/OR HORIZONTAL LEVELS OF MEMORY REDUNDANCY

FIELD OF THE INVENTION

This present invention relates generally to the transport of data between computer systems and input output systems. More specifically, the present invention is a fault-tolerant method for transferring blocks of data between computer systems and input output systems.

BACKGROUND OF THE INVENTION

In recent years, computer disk drives, and particularly hard disk drives, have been the subject of intense research and development efforts. These efforts have been directed at the attainment of a number of often contradictory goals, which include enhanced drive capacity, speed and reliability. Increasingly, so called RAID systems, or redundant arrays of inexpensive disks, have come to be regarded as the most viable solution when ultra-high performance disk drives are required. RAID systems combine a large number of independent disk drives into a single array. The independent drives are accessed in parallel with a single word (or other unit) of memory split across the many drives.

As an example of a RAID system, a system might be constructed which uses thirty-two drives for data storage. Generally, a system of this type would also include a number of additional drives for storage of error correcting codes (ECC). In use, a single word may be accessed by retrieving a single bit from each of the data drives. The integrity of the word would be protected by simultaneously retrieving the error correcting codes stored in the ECC drives. Together, the thirty-two drives and the ECC drives would provide a single system which, theoretically, yields a transfer rate which exceeds a typical drive by a factor of thirty-two. Additionally, the combined storage of the RAID system exceeds the capacity of a single system by the same factor of thirty-two. At the same time, the integrity of the data in the RAID system is protected by the correcting codes stored in the ECC drives. The overall result is that the RAID system provides a high-performance, high-capacity and high reliability system for the storage and retrieval of computer data.

The development of RAID systems has not, however, prevented the manufactures of disk drives from seeking even faster systems for computer disk drives. Nor has the development of RAID systems prevented manufacturers from attempting to develop cheaper alternatives to RAID technology. As an example, some RAID systems include a form of high-speed volatile memory. The volatile memory stores recently accessed data, allowing fast access to this data and generally accelerating the through-put of the RAID systems. Alternatively, in some cases, a high-speed volatile memory may be combined with an array of lower performance disks to produce an inexpensive disk array which still offers acceptable performance.

There are, unfortunately, several disadvantages associated with the use of volatile memory in combination with RAID systems. One such disadvantage is attributable to the increased complexity (and hence, increased unreliability) of systems which include both the basic RAID system and the additional volatile memory. Basically, in any case where a volatile memory is involved, there is a danger that the volatile memory will suffer some type of catastrophic failure, and all of the data in the volatile memory will be lost. This problem becomes increasingly severe in systems which include more than one level of volatile memory. For example, if data were to be cached at the level of the disk drives as well as at the disk controller level, there would be multiple volatile memories, each with an associated risk of failure.

Several solutions have been adopted to mitigate or avoid the ill effects associated with the failure of volatile memories. For example, for some RAID systems, a battery power supply is included to power the volatile memories in the event of a power failure. Alternatively, in some systems, volatile memories are replaced with high-speed non-volatile memory components. This latter type of system is also protected in the event of a power failure. In both cases however, the particular solution used is directed at the protection of a specific memory or memories. As a result, if an additional level of caching or buffering is added, there is, once again, a risk of data loss. This problem becomes increasingly severe as disk systems are subject to increasing levels of caching and buffering between the disk drive device and the host computer memory systems. Additionally, the same problem reoccurs as computer systems are combined into networked environments.

SUMMARY OF THE INVENTION

The present invention is a fault-tolerant method and apparatus for transporting blocks of data between an I/O subsystem, such as a RAID system, and a computer system or network. To best understand the present invention, it should first be appreciated that a datapath connecting a computer system to an I/O subsystem will generally include a number of different memory buffers. For example, in the case of a datapath which connects a computer system to a disk drive system, these memory buffers will generally include one or more disk buffers. Each disk buffer is connected to an individual disk drive and contains data being written to the disk drive or data being read from the disk drive. The datapath for a disk drive system will generally also include a disk cache memory. The disk cache is connected to each of the disk buffers and contains the most recently accessed data from each disk buffer. The disk cache is connected to a disk controller memory which contains data being written to the disk cache memory or data being read from the disk cache memory. The disk controller memory is connected, in turn, to a host main memory and host cache memory.

In the present invention, these memory buffers are organized into a memory hierarchy. For example, in the case of the disk system datapath described above, the memory buffers are organized into a hierarchy with the disk buffers at the lowest hierarchical level, followed by the disk cache, controller memory, host main memory, and host cache memory at successively higher levels in the hierarchy.

The data within each memory buffer is grouped into fixed size datablocks. In the present invention, each datablock has an associated index word. The index word contains a bit field and an address field. The bits within the address field of the index word form a physical address for the datablock. For example, in the case of the disk system datapath, the bits in the address field of an index word are the disk address for a given datablock. The bit field of an index word indicates the memory buffers where a datablock is currently resident.

For one embodiment of the present invention, fault tolerance is ensured by using a vertical mirroring strategy where each datablock in each memory buffer has one or more copies located in memory buffers at higher or lower levels of the memory hierarchy. For example, if a datablock is resident in a disk buffer, a mirror copy of the datablock exists in the disk cache. Similarly, blocks in the disk cache have mirrored copies, either in a disk buffer, or in the controller memory. The method of the present invention ensures that as a datablock moves between memory buffers, multiple copies are maintained in buffers at adjacent hierarchical levels. The method of the present invention also updates the bit field within the index word to indicate where the datablock and its mirror copies reside.

For a second embodiment of the present invention, fault tolerance is ensured by using a horizontal mirroring strategy where each datablock in each memory buffer has one or more copies located in memory buffers at the same level of the memory hierarchy. For example, in a networked environment, a datablock resident in the main memory of a host computer will have a copy, or copies, maintained in the main memory of additional host computers. For the horizontal strategy, the method of the present invention ensures that as a datablock moves between memory buffers, multiple copies are maintained in buffers at the same hierarchical level. The method of the present invention also updates the bit field within the index word to indicate where the datablock and its mirror copies reside.

In accordance with the purpose of the invention, as embodied and broadly described herein, the invention is a method for providing fault-tolerant transport of datablocks between a computer system and a disk drive, the method comprising the following steps: providing a datapath connecting the computer system to the disk drive, the datapath including a disk buffer connected to the disk drive, a disk cache connected to the disk buffer, and a controller memory connected to the disk cache, reading a datablock from the disk drive into the disk buffer, providing an index word for the datablock, altering the index word to indicate that the datablock is resident in the disk buffer, creating a mirror copy of the datablock in the disk cache, and altering the index word to indicate that the mirror copy of the datablock is resident in the disk cache.

Objects and advantages of the invention will be set forth in part in the description which follows and in part will be obvious from the description or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
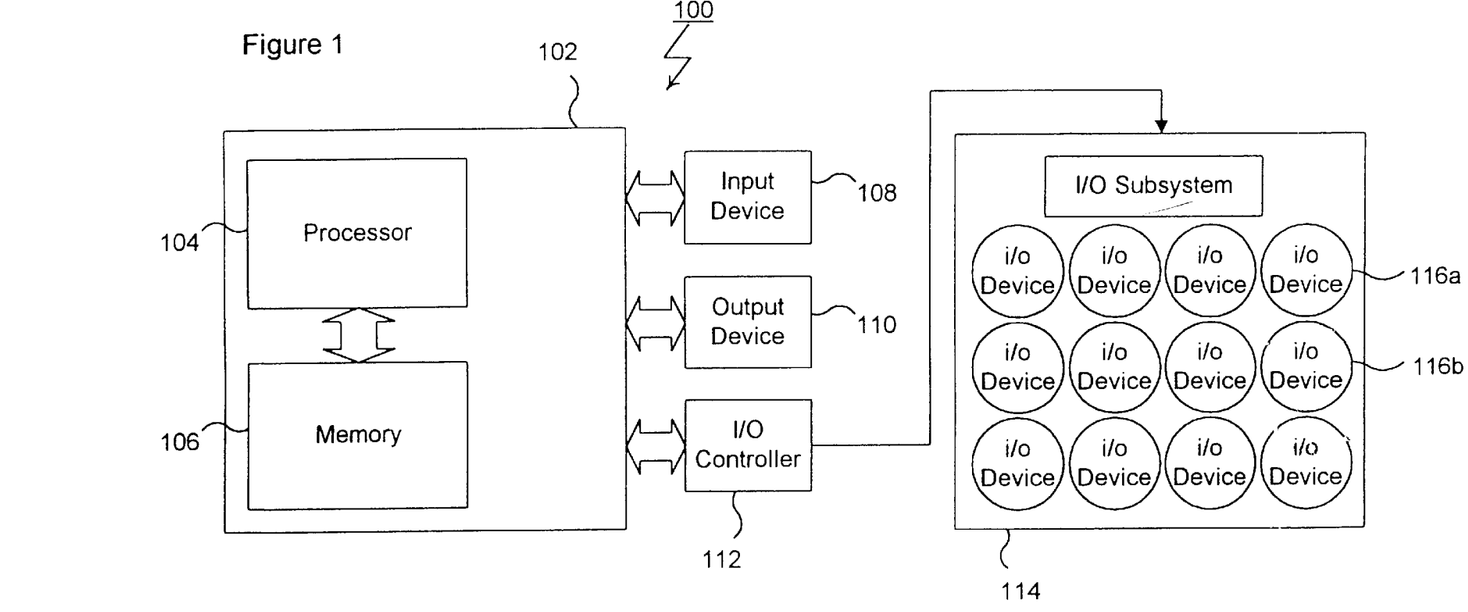
FIG. 1 is a block diagram of a computer system in accordance with a preferred embodiment of the present invention.

In FIG. 1, a computer system 100 is shown as a representative environment for the present invention. Structurally, the computer system 100 includes a host computer 102 which, in turn, includes a central processing unit, or CPU 104, and memory 106. An input device 108 and an output device 110 are connected to the host computer 102 and represent a wide range of varying I/O devices such as keyboards, modems, network adapters, printers and displays. FIG. 1 also shows that an i/o controller 112 is connected to the host computer 102. In turn, an i/o subsystem 114 is connected to the i/o controller 112. The i/o subsystem 114 includes a series of i/o devices of which device 116a and 116b are representative. In general, it should be appreciated that i/o controller 112, i/o subsystem 114 and i/o devices 116 are intended to represent a range of differing devices. For example, i/o subsystem 114 may be a RAID system, in which case i/o devices 116 would be disk drives and i/o controller 112 would be a RAID controller. The described embodiment transports blocks of data between an i/o subsystem, such as i/o subsystem 114, and a computer system, such as computer system 100.

Figure 2:
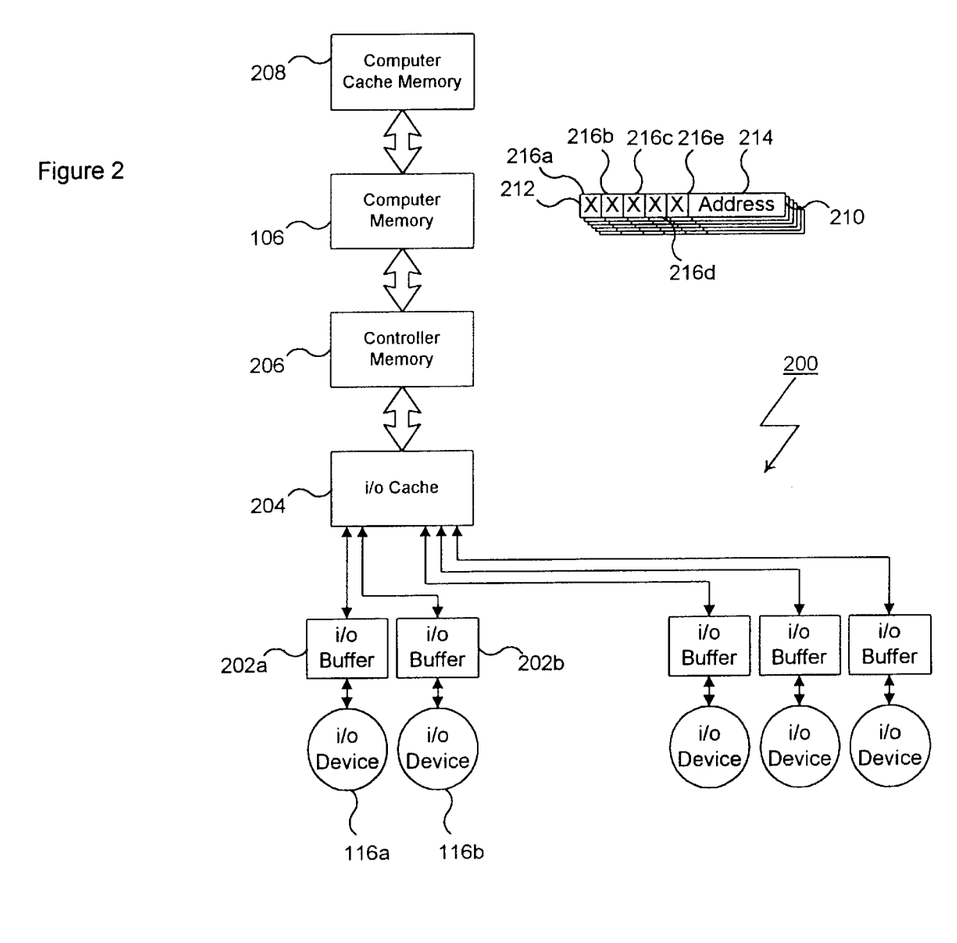
FIG. 2 is a block diagram of a datapath in accordance with the present invention.

In FIG. 2, a datapath which connects computer 100 to i/o devices 116 is shown and generally designated 200. In more detail, for datapath 200, each i/o device 116 is connected to an i/o buffer, of which i/o buffer 202a and 202b are representative. Each i/o buffer 202 contains data which is either being read from i/o device 116 or being written to i/o device 116. In general, each i/o buffer 202 will be configured to contain at least one datablock, where a datablock is a predetermined number of bytes. Typically, datablock sizes range from two-kilobytes to more than thirty-two kilobytes. Preferably, each i/o buffer 202 will be large enough to contain multiple blocks.

Each i/o buffer 202 is connected to an i/o cache 204. I/o cache 204 is a memory structure which maintains a predetermined number of blocks using a strategy which attempts to anticipate which blocks will be required in the near future. I/o cache 204 is connected, in turn, to a controller memory 206. The controller memory 206 contains all data which is either being read from, or written to, any i/o device 116. In turn, the controller memory is connected to memory 106 and cache memory 208 of computer system 100.

Overall, i/o buffers 202, i/o cache 204, controller memory 206, memory 106 and cache memory 208 of computer system 100 form a hierarchy of memory buffers. This hierarchy is traversed by data blocks moving between the computer system 100 and the disk drive 202. As a result, the hierarchy of memory buffers will generally contain a number of data blocks, each resident at different levels within the hierarchy. Each datablock has an associated index word of which index word 210 is representative. Index word 210 includes an initial bit field 212 and an address field 214. The address field 214 contains the physical address of the datablock within the media of device 116. Bit field 212 includes five index bits, designated 216a though 216e, which indicate the level of the hierarchy where a datablock is resident. More specifically, if index bit 216a is set in a particular index word 210, the datablock associated with the index word 210 is resident in computer cache memory 208. Similarly, if index bit 216b is set, the datablock is resident in computer memory 106. Index bit 216c indicates that the associated datablock is resident in controller memory 206 and index bit 216d indicates that the associated datablock is resident in i/o cache 204. Finally, index bit 216e indicates that the associated datablock is resident in i/o buffer 202. Preferably, each index word 210 is stored in a memory maintained within i/o controller 112.

Figure 3:
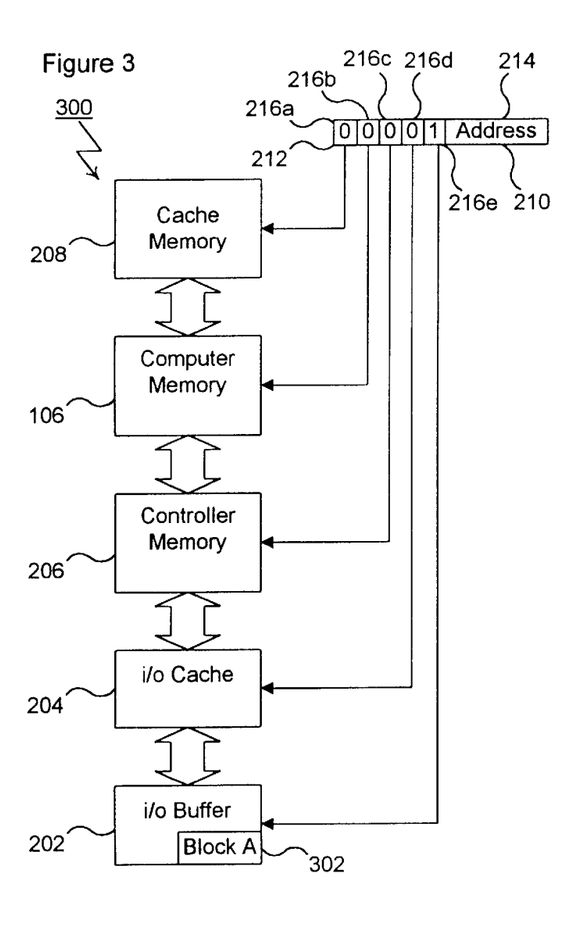
FIG. 3 is a block diagram of the datapath in accordance with the present invention after a datablock has been read from an i/o device into an i/o buffer.

Using the index word 210, the present invention provides a method for ensuring fault-tolerant movement of data blocks through the memory hierarchy. This method is better understood by reference to FIGS. 3 through 6. Referring initially to FIG. 3, the memory hierarchy previously described is shown and generally designated 300. Memory hierarchy 300 is shown with a datablock 302 resident in i/o buffer 202 indicating that datablock 302 has just been transferred from i/o device 116. Index bit 216e is set and index bits 216a through 216d are clear indicating that datablock 302 may be found only in i/o buffer 202.

Figure 4:
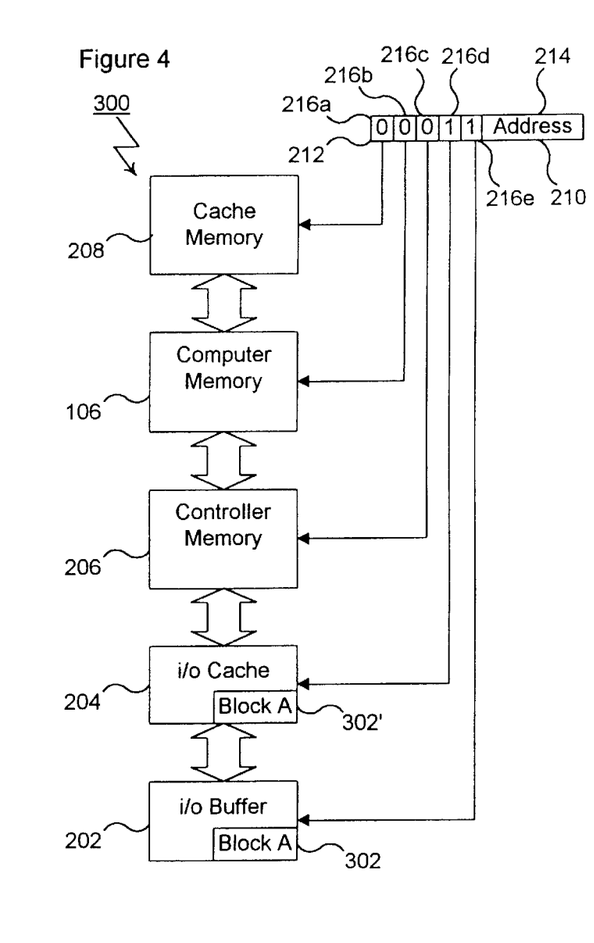
FIG. 4 is a block diagram of the datapath of FIG. 3 after creation of a mirror copy of the datablock in an i/o cache.

In FIG. 4, datablock 302 is still resident in i/o buffer 202. Additionally, however, a mirror copy of the datablock 302, designated 302' has been created in i/o cache 204. Index bits 216d and 216e are set, indicating that datablock 302 may be found either in i/o buffer 202 or in i/o cache 204. For the purposes of the present invention, the creation of mirror copy 302' may occur whenever a block, such as datablock 302, becomes resident in i/o buffer 202. In this way, mirror copy 302' will be available if i/o buffer 202 becomes unavailable.

Figure 5:
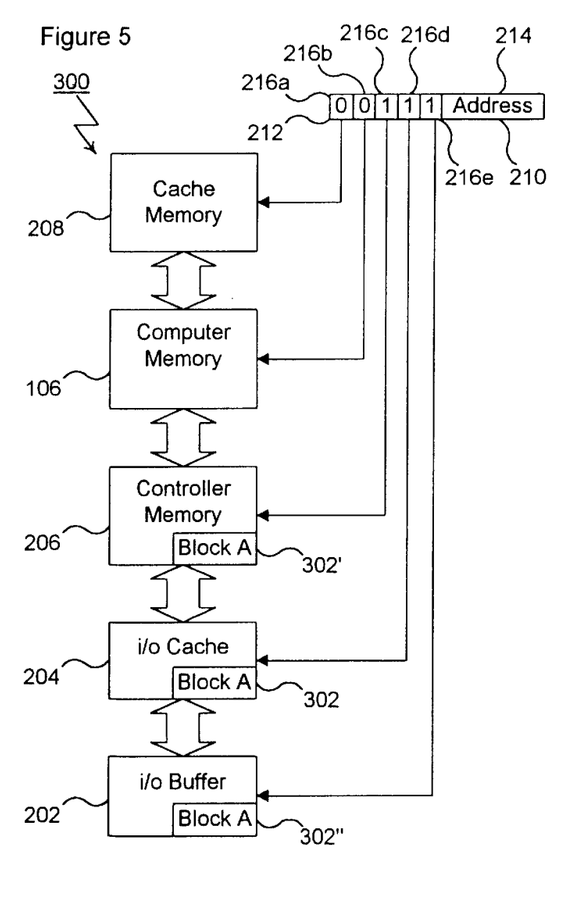
FIG. 5 is a block diagram of the datapath of FIG. 4 after movement of the datablock to the i/o cache and creation of a mirror copy of the datablock in a controller memory.

In FIG. 5, the memory hierarchy is shown after datablock 302 has been moved to i/o cache 204. As a result of this movement, a mirror copy 302' of the datablock 302 is created in controller memory 206. Additionally, the previous copy of the datablock 302 still remains in the i/o buffer 202 and is now designated 302". Index bits 216c through 216e are set, indicating that the datablock 302, or one of its copies, is resident in the controller memory 206, i/o cache 204 and the i/o buffer 202.

Figure 6:
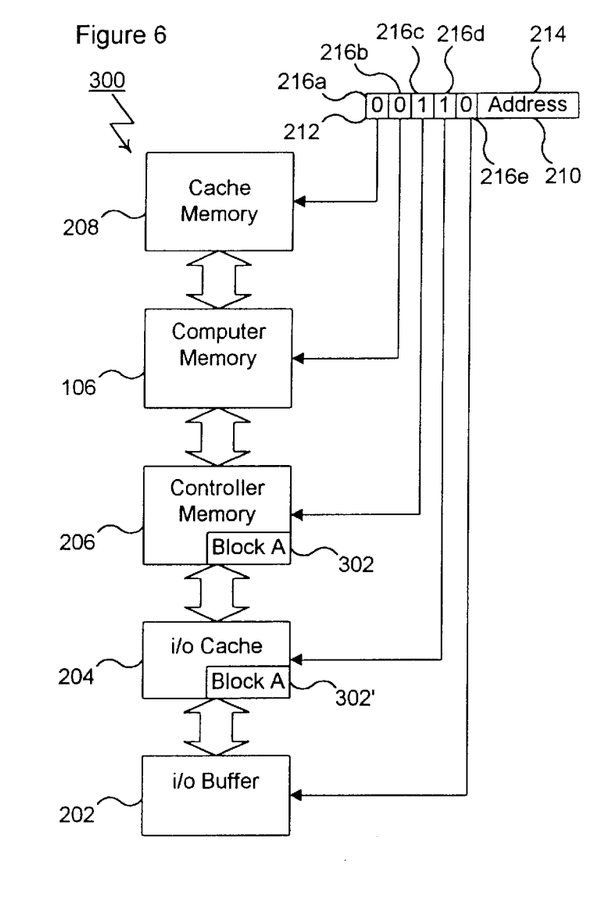
FIG. 6 is a block diagram of the datapath of FIG. 5 after clearing of the datablock from the i/o buffer.

FIG. 6 shows the same memory hierarchy after the i/o buffer 202 has been cleared of the previous copy 302". As a result of this clearing operation, the index word 206 has been updated so that only bits 216c and 216d are set indicating that the datablock 302 is resident in the controller memory 206 and the i/o cache 204.

Comparison of FIGS. 3 through 6 shows that as the datablock 302 moves through the memory hierarchy, a copy, such as mirror copy 302', is always maintained. Additionally, the index word 210 associated with each datablock 302 is always updated to indicate the locations of the datablock 302 and its copies. This same methodology is maintained as the datablock 302 moves to higher levels of the memory hierarchy 300. As a result, blocks 302 which reside in the computer memory 106 of controller memory 206 will have copies maintained in adjacent levels of the memory hierarchy 300. The same technique may be applied to memory hierarchies which include either more or fewer elements than the memory hierarchy 300 of FIGS. 3 through 6. Preferably, the updating of the index word 210 is performed by a microcontroller using an interrupt driven methodology. As a datablock 302 moves in the memory hierarchy 300, the microcontroller is interrupted and caused to update the index word 210 associated with the datablock 302.

In some cases, it may be desirable to reduce the amount of memory used for the multiple copies of datablock 302 which exist within the memory hierarchy 300. In these cases, each copy may be compressed using a compression method as is well known in the pertinent art. The compressed copies would only be reconstituted in the event that the datablock 302 became inaccessible.

Figure 7:
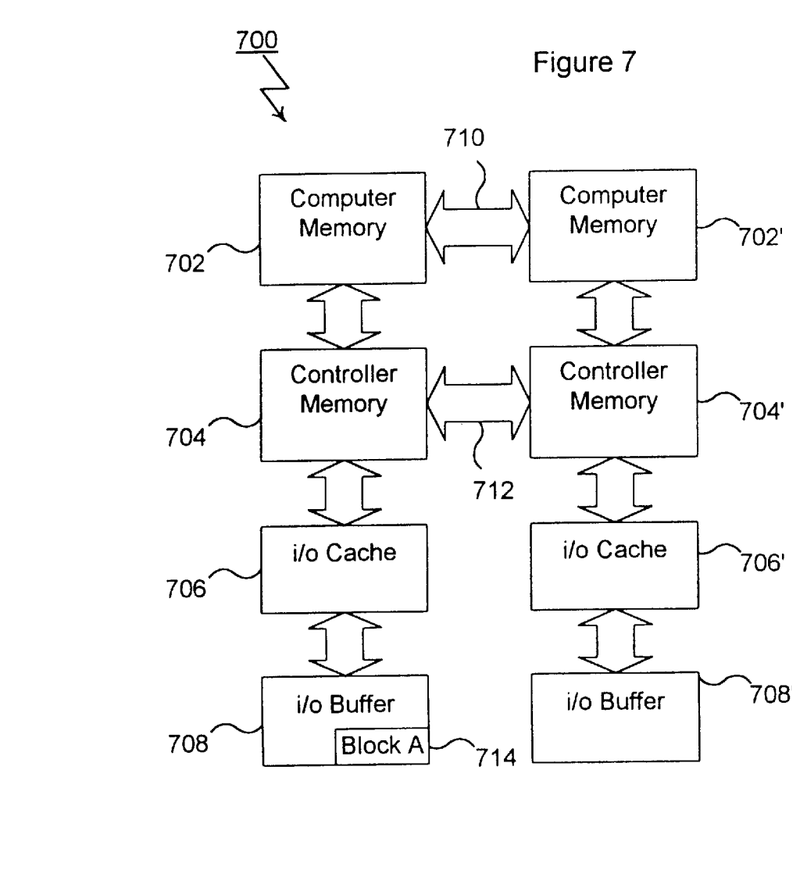
FIG. 7 is a block diagram of a computer network in accordance with an alternate embodiment of the present invention after a datablock has been read from an i/o drive into an i/o buffer.

A second embodiment of the present invention is shown in FIGS. 7 through 10. More specifically, FIG. 7 shows a networked computer system 700 which includes a computer memory 702 connected to a controller memory 704. The controller memory 704 is connected, in turn, to an i/o cache 706. The i/o cache 706 is connected to an i/o buffer 708. Generally, computer memory 702, controller memory 704, i/o cache 706 and i/o buffer 708 are similar to those employed in datapath 200 of FIG. 2. For the sake of brevity, these structures will not be re-described here.

In FIG. 7, computer memory 702 is shown in combination with a second computer memory 702'. Likewise, controller memory 704, i/o cache 706 and i/o buffer 708 are shown in combination with second controller memory 704', second i/o cache 706' and second i/o buffer 708', respectively. Computer memory 702 is functionally linked to second computer memory 702' using a computer network 710 or other communications system. Similarly, controller memory 704 is functionally linked to controller memory 704' using a bus 712 or other communications system. Network 710 and bus 712 allow datablocks in computer memory 702, controller memory 704, i/o cache 706 or i/o buffer 708 to be moved to or from computer memory 702', controller memory 704', i/o cache and 706' and i/o buffer 708'.

Figure 8:
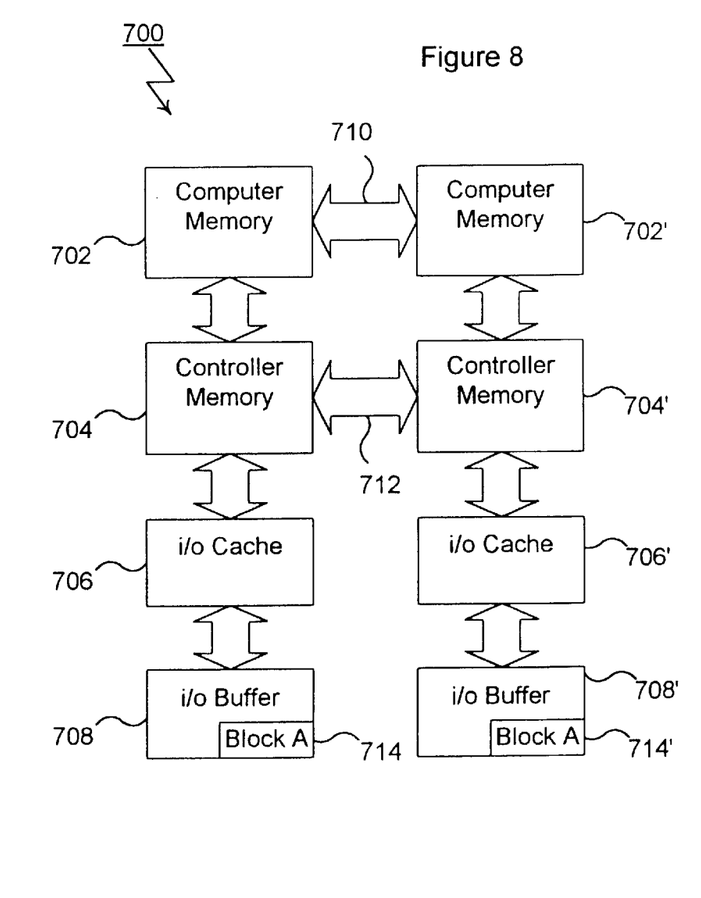
FIG. 8 is a block diagram of the computer network of FIG. 7 after creation of a mirror copy of the datablock in an i/o buffer.
Figure 9:
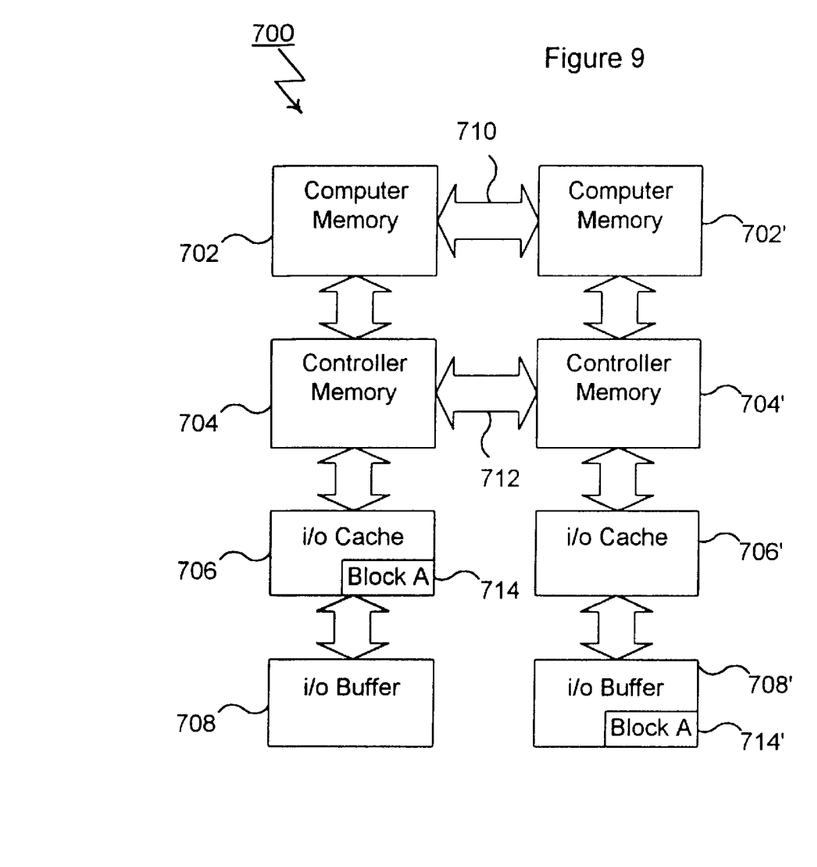
FIG. 9 is a block diagram of the datapath of FIG. 8 after movement of the datablock to the i/o cache.
Figure 10:
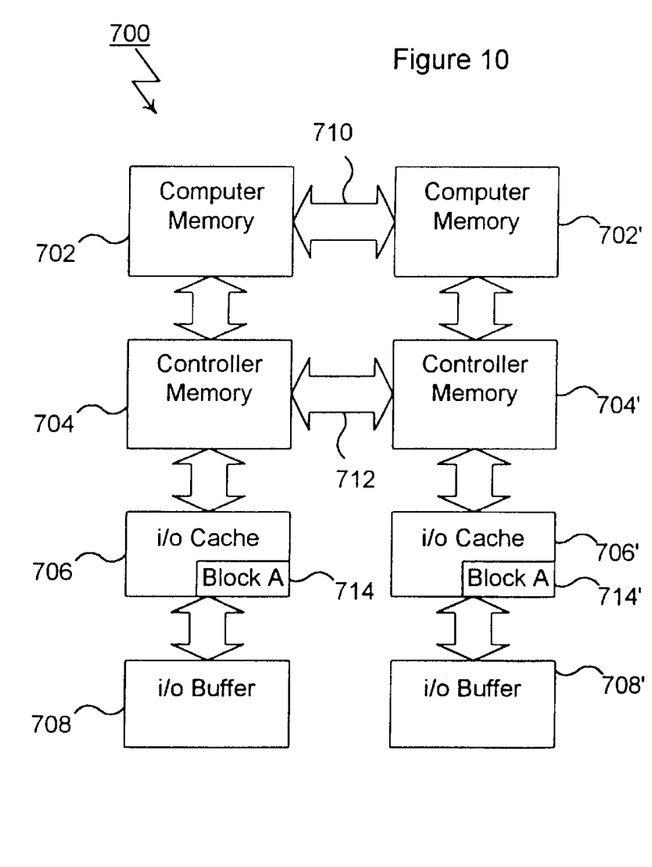
FIG. 10 is a block diagram of the datapath of FIG. 8 after creation of a mirror copy of the datablock in an i/o cache.

The present invention provides fault tolerant movement of datablocks within the networked computer system 700 by using a horizontal mirroring strategy. More specifically, in FIG. 7, a datablock 714 is shown in i/o buffer 708 indicating that the datablock 714 has just been read from an i/o device, such as i/o device 116a. In FIG. 8, the same datablock 714 is shown in the same i/o buffer 708. In FIG. 8, however, a mirror copy of the datablock 714' has been created in i/o buffer 708'. This mirror copy 714' has been created by transmitting a copy of the data in datablock 714 to i/o buffer 708' using bus 712. In FIG. 9, datablock 714 has been moved from i/o buffer 708 to i/o cache 706. This movement, of course, corresponds to the normal movement of datablock through the networked computer system 700. Finally, in FIG. 10, a mirror copy of the datablock 714' has been created in i/o cache 706'. This mirror copy 714' has been created, once again, by transmitting a copy of the data in datablock 714 to i/o cache 706' using bus 712. Thus, the alternate embodiment of the present invention insures fault tolerance by maintaining a copy of each datablock, in each memory buffer, in a memory buffer at the same hierarchical level.

Figure 11:
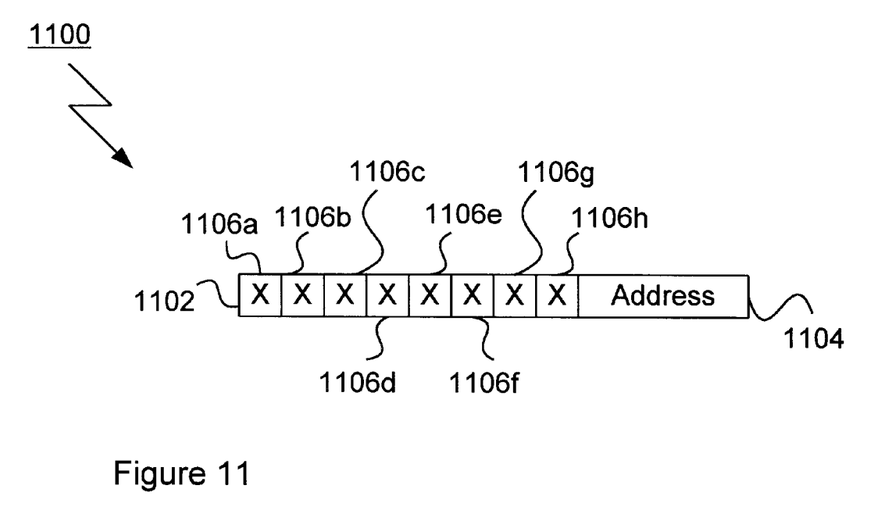
FIG. 11 is a block diagram of an index word as used by the alternate embodiment of FIGS. 7 through 10.

For the networked computer system, each datablock has an associated index word of the type shown in FIG. 11 and generally designated 1100. Index word 1100 includes an initial bit field 1102 and an address field 1104. The address field contains the physical address of the datablock within the media of device 116. Bit field 1102 includes four index bits, designated 1106a though 1106d, which indicate the level of the hierarchy where a datablock is resident. More specifically, if index bit 1106a is set in a particular index word 1100, the datablock associated with the index word 1100 is resident in computer memory 702. Similarly, if index bit 1106b is set, the datablock is resident in controller memory 704. Index bit 1106c indicates that the associated datablock is resident in i/o cache 706 and index bit 1106d indicates that the associated datablock is resident in i/o buffer 708.

Bit field 1102 also includes four index bits, designated 1106e though 1106h, which indicate the level of the hierarchy where the mirror copy of a datablock is resident. More specifically, if index bit 1106e is set in a particular index word 1100, the mirror copy associated with the index word 1100 is resident in computer memory 702'. Similarly, if index bit 1106e is set, the mirror copy is resident in controller memory 704'. Index bit 1106e indicates that the associated mirror copy is resident in i/o cache 706' and index bit 1106h indicates that the associated mirror copy is resident in i/o buffer 708'.

Importantly, for the purposes of the present invention, the fault tolerance provided by the horizontal mirroring strategy may be enhanced by replicated the horizontal mirroring strategy across multiple computer systems in a single network. Thus, datablocks resident within a single computer system have redundant copies on separate computer systems within the network.

What is claimed is:

1. A method for providing fault-tolerant transport of datablocks within a computer system, the system having an I/O subsystem with a datapath connecting the computer system to the I/O subsystem, each datapath including a plurality of memory buffers organized in a memory hierarchy, the method comprising the steps of:

providing a plurality of index words;

copying a datablock into a first level of the memory hierarchy in the datapath;

altering an index word associated with the datablock to indicate that the datablock is resident in the first level of the memory hierarchy;

creating a mirror copy of the datablock in a second level of the memory hierarchy in the datapath;

altering the index word associated with the datablock to indicate that the mirror copy of the datablock is resident in the second level of the memory hierarchy;

creating a mirror copy of the datablock in a third level of the memory hierarchy;

altering the index word associated with the datablock to indicate that the mirror copy of the datablock is resident in a third level of the memory hierarchy;

clearing the datablock from the first level of the memory hierarchy; and altering the index word associated with the datablock to indicate that the datablock is not resident in the first level of the memory hierarchy.

2. A method for providing fault-tolerant transport of datablocks within a network of computer systems, each computer system having an I/O subsystem, the method comprising the steps of:

providing a plurality of datapaths, including a first datapath and a second datapath, each datapath connecting one computer system to the I/O subsystem of the computer, each datapath including a plurality of memory buffers organized in a memory hierarchy;

providing a plurality of index words;

copying a datablock into a first level of the memory hierarchy of the first datapath;

altering an index word associated with the datablock to indicate that the datablock is resident in the first level of the memory hierarchy of the first datapath;

creating a mirror copy of the datablock in the first level of the memory hierarchy of the second datapath;

altering the index word associated with the datablock to indicate that the mirror copy of the datablock is resident in the first level of the memory hierarchy of the second datapath;

copying the datablock from the first level of the memory hierarchy to the second level of the memory hierarchy of the first datapath;

altering the index word associated with the datablock to indicate that the datablock is resident in the second level of the memory hierarchy of the first datapath;

creating a mirror copy of the datablock in the second level of the memory hierarchy of the second datapath;

altering the index word associated with the datablock to indicate that the mirror copy of the datablock is resident in the second level of the memory hierarchy of the second datapath;

clearing the datablock from the first level of the memory hierarchy; and altering the index word associated with the datablock to indicate that the datablock is not resident in the first level of the memory hierarchy.

3. A method for providing fault-tolerant transport of datablocks between a computer system and a disk drive, a datapath connects the computer system to the disk drive, the datapath including a disk buffer connected to the disk drive, a disk cache connected to the disk buffer, and a controller memory connected to the disk cache, the method comprising the steps of:

reading a datablock from the disk drive into the disk buffer;

providing an index word for the datablock;

altering the index word to indicate that the datablock is resident in the disk buffer;

creating a mirror copy of the datablock in the disk cache;

altering the index word to indicate that the mirror copy of the datablock is resident in the disk cache;

creating a mirror copy of the datablock in the controller memory;

altering the index word to indicate that the mirror copy of the datablock is resident in the controller memory;

clearing the datablock from the drive buffer; and altering the index word to indicate that the datablock is not resident in the drive buffer.

4. A method as recited in claim 3 further comprising the step of restoring the datablock from the mirror copy.

5. A method as recited in claim 4 further comprising the steps of:

creating a mirror copy of the datablock in the memory of the computer system;

altering the index word to indicate that the mirror copy of the datablock is resident in the memory of the computer system;

clearing the datablock from the disk cache; and altering the index word to indicate that the datablock is not resident in the disk cache.

6. A method as recited in claim 5 further comprising the step of restoring the datablock from the mirror copy.

7. A method as recited in claim 5 further comprising the step of restoring the datablock from the mirror copy.

8. A method for providing fault-tolerant transport of datablocks between a computer system and a disk drive, the method comprising the steps of:

providing a datapath connecting the computer system to the disk drive, the datapath including a plurality of memory buffers organized in a memory hierarchy;

providing a plurality of index words;

copying a datablock into a first level of the memory hierarchy altering an index word associated with the datablock to indicate that the datablock is resident in the first level of the memory hierarchy;

creating a mirror copy of the datablock in a second level of the memory hierarchy;

altering the index word associated with the datablock to indicate that the mirror copy of the datablock is resident in the second level of the memory hierarchy;

creating a mirror copy of the datablock in a third level of the memory hierarchy;

altering the index word associated with the datablock to indicate that the mirror copy of the datablock is resident in a third level of the memory hierarchy;

clearing the datablock from the first level of the memory hierarchy; and altering the index word associated with the datablock to indicate that the datablock is not resident in the first level of the memory hierarchy.

* * * * *